United States Patent
Guan et al.

(10) Patent No.: US 11,411,577 B2
(45) Date of Patent: Aug. 9, 2022

(54) DATA COMPRESSION METHOD, DATA DECOMPRESSION METHOD, AND RELATED APPARATUS

(71) Applicant: Huawei Technologies Co., Ltd., Shenzhen (CN)

(72) Inventors: Kun Guan, Saint Petersburg (RU); Aleksei Valentinovich Romanovskii, Saint Petersburg (RU); Shaohui Quan, Hangzhou (CN); Gongyi Wang, Hangzhou (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 17/244,470

(22) Filed: Apr. 29, 2021

(65) Prior Publication Data
US 2021/0250042 A1    Aug. 12, 2021

Related U.S. Application Data

(63) Continuation of application No. PCT/CN2019/110589, filed on Oct. 11, 2019.

(30) Foreign Application Priority Data

Oct. 31, 2018    (RU) .................... RU2018138390

(51) Int. Cl.
H03M 7/30    (2006.01)
(52) U.S. Cl.
CPC ........... *H03M 7/3064* (2013.01); *H03M 7/60* (2013.01)
(58) Field of Classification Search
CPC ........ H03M 7/30; H03M 7/6041; H03M 7/60; H03M 7/3064

USPC ..................................................... 341/50–90
See application file for complete search history.

(56) References Cited

U.S. PATENT DOCUMENTS

| | | | | |
|---|---|---|---|---|
| 8,751,462 | B2* | 6/2014 | Huang | G06F 11/1453 707/693 |
| 9,170,757 | B1 | 10/2015 | Shihadeh et al. | |
| 9,268,711 | B1 | 2/2016 | Clark et al. | |
| 10,972,125 | B2* | 4/2021 | Wegener | H03M 7/6011 |
| 11,210,032 | B1* | 12/2021 | Nagao | H03M 7/3095 |

(Continued)

FOREIGN PATENT DOCUMENTS

| | | |
|---|---|---|
| CN | 1728561 A | 2/2006 |
| CN | 101166273 A | 4/2008 |

(Continued)

OTHER PUBLICATIONS

Sudhan S et al: "Combined Data Compression and Error Correction", Advances in Communications, Computing, Networks and Security 7, Dec. 31, 2010, XP055852299, 10 Pages.

(Continued)

*Primary Examiner* — Lam T Mai
(74) *Attorney, Agent, or Firm* — Conley Rose, P.C.

(57) ABSTRACT

A data compression method includes obtaining N to-be-compressed data blocks and N pieces of protection information (PI), where the N to-be-compressed data blocks are in a one-to-one correspondence with the N pieces of PI, and N is a positive integer greater than or equal to 2, compressing the N to-be-compressed data blocks to obtain a compressed data block, and compressing the N pieces of PI to obtain compressed PI.

20 Claims, 4 Drawing Sheets

(56) References Cited

U.S. PATENT DOCUMENTS

| | | | | |
|---|---|---|---|---|
| 2003/0154344 A1* | 8/2003 | Itoi | ...................... | G11B 27/036 |
| | | | | 711/100 |
| 2011/0161774 A1 | 6/2011 | Shin et al. | | |
| 2011/0317547 A1* | 12/2011 | Baudoin | ............... | H04L 69/161 |
| | | | | 370/216 |
| 2014/0040702 A1* | 2/2014 | He | ...................... | H03M 13/373 |
| | | | | 714/766 |
| 2015/0145878 A1* | 5/2015 | Kim | ...................... | H04N 19/12 |
| | | | | 345/555 |
| 2020/0264778 A1* | 8/2020 | Yang | ..................... | G06F 3/0671 |
| 2021/0357379 A1* | 11/2021 | Louvau | ................. | H03M 7/425 |

FOREIGN PATENT DOCUMENTS

| | | |
|---|---|---|
| CN | 103577274 A | 2/2014 |
| CN | 103926527 A | 7/2014 |
| CN | 103942292 A | 7/2014 |
| CN | 104572987 A | 4/2015 |
| CN | 105511812 A | 4/2016 |

OTHER PUBLICATIONS

Anonymous: "Data Integrity Field",Wikipedia, Mar. 25, 2018 (Mar. 25, 2018), pp. 1-2, XP055852888, 2 Pages.

* cited by examiner

| To-be-compressed data block 1 | PI 1 | To-be-compressed data block 2 | PI 2 | To-be-compressed data block 3 | PI 3 | To-be-compressed data block 4 | PI 4 | To-be-compressed data block 5 | PI 5 |

FIG. 3

| To-be-compressed data block 1 | To-be-compressed data block 2 | To-be-compressed data block 3 | To-be-compressed data block 4 | To-be-compressed data block 5 | PI 1 | PI 2 | PI 3 | PI 4 | PI 5 |

| Version field | Check information tag field | Tag field of version information of an application program | Application program information tag field | Reference information tag field | Reserved field |

DATA COMPRESSION METHOD, DATA DECOMPRESSION METHOD, AND RELATED APPARATUS

CROSS-REFERENCE TO RELATED APPLICATIONS

This application is a continuation of International Patent Application No. PCT/CN2019/110589 filed on Oct. 11, 2019, which claims priority to Russian Patent Application No. 2018138390 filed on Oct. 31, 2018. The disclosures of the aforementioned applications are hereby incorporated by reference in their entireties.

TECHNICAL FIELD

This application relates to the field of information technologies, and in particular, to a data compression method, a data decompression method, and a related apparatus.

BACKGROUND

In processes such as storage and transmission, data may pass through a plurality of components and various transmission paths, and may be subject to complex software processing. Any error occurred in the processes may cause a data error. However, when an error occurs, no alarm, log, error information, or notification in any form is generated. This error is referred to as silent data corruption.

To identify whether the silent data corruption occurs in the data, a data consistency technology is introduced in the industry. According to data consistency, integrity of a data block is ensured by inserting protection information (PI) into each data block. The PI may also be referred to as a data integrity field (DIF).

Further, to-be-processed data is divided into a plurality of data blocks based on a predetermined size (for example, a size of a sector: 512 bytes). One piece of PI is added after each data block, and the PI is generated based on a corresponding data block. During transmission, the data passes through a checkpoint, and the checkpoint checks whether a data block matches a piece of corresponding PI. If the data block does not match the corresponding PI, an error is returned. If the data block matches the corresponding PI, the transmission continues.

However, when data with a piece of PI is compressed, the PI is not compressed. In the foregoing processing manner, because the PI is not compressed, a data volume obtained after compression is relatively large.

SUMMARY

This application provides a data compression method, a data decompression method, and a related apparatus, to improve a compression effect of a to-be-compressed data block.

According to a first aspect, an embodiment of this application provides a data compression method. The method includes obtaining N to-be-compressed data blocks and N pieces of PI, where the N to-be-compressed data blocks are in a one-to-one correspondence with the N pieces of PI, and N is a positive integer greater than or equal to 2, compressing the N to-be-compressed data blocks to obtain a compressed data block, and compressing the N pieces of PI to obtain compressed PI. In the foregoing technical solution, the to-be-compressed data block and the PI are separately compressed, to improve a compression effect of the to-be-compressed data block. In addition, a compressed data block and compressed PI are separate. In other words, the compressed PI is not associated with the compressed data block. Therefore, after data with the PI is compressed, the compressed PI may be directly used.

With reference to the first aspect, in a possible implementation of the first aspect, the N pieces of PI include information having a specific rule. Compressing the N pieces of PI to obtain compressed PI includes compressing the N pieces of PI based on the information having the specific rule, to obtain the compressed PI. In the foregoing technical solution, the PI is compressed based on the information, having the specific rule, in the PI. In this way, a length of the compressed PI can be reduced, and the compressed PI may be decompressed without being affected, to restore the N pieces of PI.

With reference to the first aspect, in a possible implementation of the first aspect, addresses used to store the N to-be-compressed data blocks are consecutive, and addresses used to store the N pieces of PI are consecutive. In this way, it is convenient to compress the N pieces of PI and the N to-be-compressed data blocks.

With reference to the first aspect, in a possible implementation of the first aspect, obtaining N to-be-compressed data blocks and N pieces of PI includes obtaining M to-be-compressed data blocks and M pieces of PI, where the M to-be-compressed data blocks are in a one-to-one correspondence with the M pieces of PI, the M to-be-compressed data blocks include the N to-be-compressed data blocks, the M pieces of PI include the N pieces of PI, and M is a positive integer greater than or equal to N, determining whether the M to-be-compressed data blocks include a redundant to-be-compressed data block, and when the M to-be-compressed data blocks include the redundant to-be-compressed data block, deleting the redundant to-be-compressed data block from the M to-be-compressed data blocks to obtain the N to-be-compressed data blocks, and deleting, from the M pieces of PI, a piece of PI corresponding to the redundant to-be-compressed data block, to obtain the N pieces of PI, where when the M to-be-compressed data blocks do not include the redundant to-be-compressed data block, the M to-be-compressed data blocks are the N to-be-compressed data blocks, and the M pieces of PI are the N pieces of PI. In the foregoing technical solution, the redundant data block in the to-be-compressed data blocks is deleted. This reduces the to-be-compressed data blocks, and improves a data compression rate.

With reference to the first aspect, in a possible implementation of the first aspect, determining whether the M to-be-compressed data blocks include a redundant to-be-compressed data block includes determining whether the M pieces of PI include a plurality of pieces of PI with same check information. Whether there is the redundant to-be-compressed data block may be quickly determined by determining the check information. This may increase a speed of determining the redundant to-be-compressed data block.

With reference to the first aspect, in a possible implementation of the first aspect, when check information in the M pieces of PI is different, the M to-be-compressed data blocks do not include the redundant to-be-compressed data block, when check information in K of the M pieces of PI is the same, byte-by-byte comparison is performed on K to-be-compressed data blocks corresponding to the K pieces of PI, where K is a positive integer greater than or equal to 2 and less than or equal to M, when byte-by-byte comparison results of the K to-be-compressed data blocks are different, the K to-be-compressed data blocks do not include the redundant to-be-compressed data block, and when byte-by-byte comparison results of K' of the K to-be-compressed data blocks are the same, the K' to-be-compressed data blocks include K'-1 redundant to-be-compressed data blocks, where K' is a positive integer greater than or equal to 2 and less than or equal to K. A byte-by-byte comparison manner may ensure that a non-redundant to-be-compressed data block is not deleted.

According to a second aspect, an embodiment of this application provides a data decompression method. The method includes obtaining to-be-decompressed data, where the to-be-decompressed data includes a compressed data block and compressed PI, decompressing the compressed data block to obtain N data blocks, where N is a positive integer greater than or equal to 2, and determining N pieces of PI based on the compressed PI and the N data blocks, where the N data blocks are in a one-to-one correspondence with the N pieces of PI. In the foregoing technical solution, compressed data may be restored to the original data.

With reference to the second aspect, in a possible implementation of the second aspect, the determining N pieces of PI based on the compressed PI and the N data blocks includes determining N pieces of check information based on the N data blocks, determining N pieces of information based on the compressed PI, where the N pieces of information have a specific rule, and the compressed PI includes one of the N pieces of information, and determining the N pieces of PI, where each of the N pieces of PI includes one of the N pieces of check information, and each of the N pieces of PI includes one of the N pieces of information.

With reference to the second aspect, in a possible implementation of the second aspect, addresses used to store the N data blocks are consecutive, and addresses used to store the N pieces of PI are consecutive.

With reference to the second aspect, in a possible implementation of the second aspect, the method further includes determining M data blocks and M pieces of PI based on the N data blocks and the N pieces of PI, where the M data blocks are in a one-to-one correspondence with the M pieces of PI, the M data blocks include the N data blocks, the M pieces of PI include the N pieces of PI, M is a positive integer greater than N, MN data blocks in the M data blocks are redundant data blocks of at least one data block in the N data blocks, MN pieces of PI in the M pieces of PI correspond to the redundant data blocks, and M is a positive integer greater than N.

According to a third aspect, an embodiment of this application provides a data compression apparatus. The data compression apparatus includes a unit configured to implement the first aspect or any one of the possible implementations of the first aspect.

According to a fourth aspect, an embodiment of this application provides a data decompression apparatus. The data decompression apparatus includes a unit configured to implement the second aspect or any one of the possible implementations of the second aspect.

According to a fifth aspect, an embodiment of this application provides a storage medium. The storage medium stores an instruction used to implement the method according to the first aspect or any one of the possible implementations of the first aspect.

According to a sixth aspect, an embodiment of this application provides a storage medium. The storage medium stores an instruction used to implement the method according to the second aspect or any one of the possible implementations of the second aspect.

According to a seventh aspect, this application provides a computer program product including an instruction. When the computer program product runs on a computer, the computer is enabled to perform the method according to the first aspect or any one of the possible implementations of the first aspect.

According to an eighth aspect, this application provides a computer program product including an instruction. When the computer program product runs on a computer, the computer is enabled to perform the method according to the second aspect or any one of the possible implementations of the second aspect.

DESCRIPTION OF EMBODIMENTS

The following describes the technical solutions of this application with reference to the accompanying drawings.

The embodiments of the present disclosure may be applied to a storage system, such as a storage array or a distributed storage system, or may be applied to a scenario such as a host or a server. This is not limited in the embodiments of the present disclosure. When the storage array performs an operation such as data compression or data decompression, the operation may be performed by a controller of the storage array, and may be performed by a processor of the controller of the storage array. When the distributed storage system performs the operation such as data compression or data decompression, the operation may be performed by a storage node in the distributed storage system, and may be performed by a processor of the storage node. When the host or the server performs the operation such as data compression or data decompression, the operation may be performed by a processor of the host or the server. The processor in the embodiments of the present disclosure may include a central processing unit (CPU) and a memory. In addition, to save computing resources of the CPU, a field-programmable gate array (FPGA) or other hardware may also be configured to perform all operations of the CPU, or the FPGA or other hardware and the CPU are separately configured to perform some operations of the CPU. For ease of description, in the embodiments of the present disclosure, the processor is used to refer to a combination of the CPU and the memory, and the foregoing various implementations. In addition, the embodiments of the present disclosure may be further applied to compressing and decompressing data in a storage hard disk. The embodiments of the present disclosure may also be applied to a consumer-oriented product, for example, a personal computer, a notebook computer, a tablet computer, a mobile device, or a mobile phone.

Figure 1:
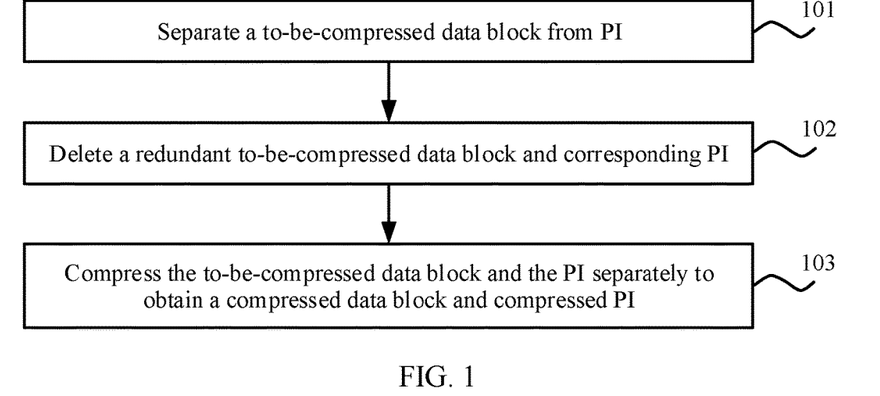
FIG. 1 is a schematic flowchart of a data compression method according to an embodiment of this application.

FIG. 1 is a schematic flowchart of a data compression method according to an embodiment of this application.

101: Separate a to-be-compressed data block from PI.

102: Delete a redundant to-be-compressed data block and corresponding PI.

103: Compress the to-be-compressed data block and the PI separately to obtain a compressed data block and compressed PI, where the compressed data block is obtained by compressing the to-be-compressed data block, and the compressed PI is obtained by compressing the PI.

Therefore, the to-be-compressed data block and the PI are separately compressed, to improve a compression effect of the to-be-compressed data block. Further, if the to-be-compressed data block is associated with the PI (in other words, one to-be-compressed data block is followed by one piece of PI, the PI is followed by another to-be-compressed data block, and so on), the PI affects compression efficiency of the to-be-compressed data block. However, in the method shown in FIG. 1, a plurality of to-be-compressed data blocks are not separated by the PI. Therefore, the PI may be prevented from affecting compression of the to-be-compressed data block, to improve the compression effect of the to-be-compressed data block. In addition, the compressed data block and compressed PI are separate. In other words, the compressed PI is not associated with the compressed data block. Therefore, after data with the PI is compressed, the compressed PI may be directly used.

The following describes in detail each step of the method shown in FIG. 1 with reference to FIG. 2 to FIG. 8.

Figure 2:
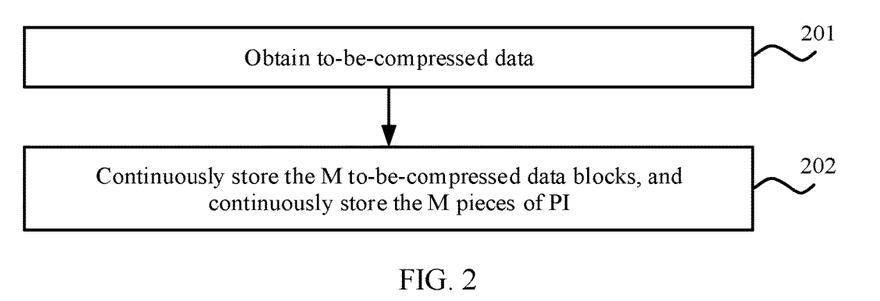
FIG. 2 is a schematic flowchart of a method for separating a data block from PI according to an embodiment of this application.

FIG. 2 is a schematic flowchart of a method for separating a data block from PI according to an embodiment of this application.

201: Obtain to-be-compressed data, where the to-be-compressed data includes M to-be-compressed data blocks and M pieces of PI, and the M to-be-compressed data blocks are in a one-to-one correspondence with the M pieces of PI.

How to insert the PI into the data is not limited in this embodiment of this application. In other words, a manner of dividing the data that is to be inserted with the PI into a plurality of data blocks and determining the corresponding PI based on the data block is not limited in this embodiment of this application. However, for ease of description, in this embodiment of this application, it is assumed that a size of each data block is 512 bytes, and a size of each piece of PI is 8 bytes.

The 8-byte PI may include the following information: 2-byte check information, 2-byte application information, and 4-byte reference information.

The check information may also be referred to as a guard tag, and is determined based on a data block corresponding to the PI. A checkpoint may verify, based on the check information, whether an error occurs in data in the data block corresponding to the PI. The check information may be a cyclic redundancy check (CRC) value generated based on the data block corresponding to the PI. The CRC value has the following feature: If the data in the data block used to generate the CRC value changes, the CRC value generated based on the data block also changes. Therefore, the checkpoint may calculate a CRC value based on a data block, and then compare the calculated CRC value with a CRC value in PI corresponding to the data block. If the two CRC values are the same, the data block matches the PI, and no error occurs in the data block. If the two CRC values are different, the data block does not match the PI, and an error occurs in the data block. It may be understood that, the CRC value may be used as the check information. In addition, another algorithm may be used to generate, based on the data block, the check information used to check the data block, provided that the generated check information has the same feature as the CRC value.

The application information may also be referred to as an application tag, and the application information may include some information related to an application program. For example, the information related to the application program may include application program information and version information of the application program. The application program information may be a name, an identifier, or other similar information of the application program. The version information of the application program may be information such as a version number or a version code of the application program.

The reference information may also be referred to as a reference tag. The reference information includes a logical block address (LBA) of the data block corresponding to the PI. For example, the LBA may be an LBA used to store the data block corresponding to the PI. For another example, the LBA may be an offset value relative to a specific LBA, and the specific LBA plus the offset value is the LBA used to store the data block corresponding to the PI. The data block corresponding to the PI may be determined based on the reference information. Certainly, the reference information may alternatively be other information that can be used to reflect a correspondence between the PI and the data block.

202: Continuously store the M to-be-compressed data blocks, and continuously store the M pieces of PI. In this way, separating the to-be-compressed data block from the PI is completed.

Further, the continuously storing the M to-be-compressed data blocks means storing the M to-be-compressed data blocks by using storage units whose addresses are consecutive. In other words, the addresses used to store the M to-be-compressed data blocks are consecutive. Similarly, the continuously storing the M pieces of PI means storing the M pieces of PI by using storage units whose addresses are consecutive. In other words, the addresses used to store the M pieces of PI are consecutive. For ease of description, in the following, the to-be-compressed data obtained in step 201 is referred to as first to-be-compressed data, and the to-be-compressed data obtained in step 202 is referred to as second to-be-compressed data.

Figure 3:
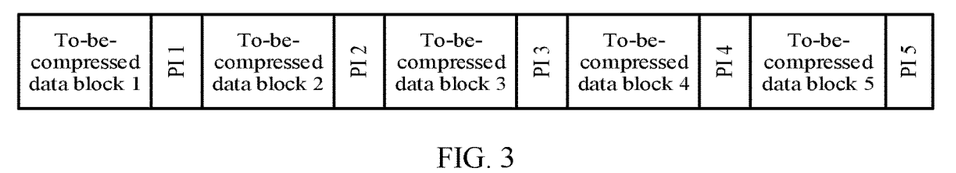
FIG. 3 is a schematic diagram of first to-be-compressed data.

FIG. 3 is a schematic diagram of first to-be-compressed data. As shown in FIG. 3, the first to-be-compressed data includes five to-be-compressed data blocks and five pieces of PI. PI 1 corresponds to a to-be-compressed data block 1, PI 2 corresponds to a to-be-compressed data block 2, and so on. In this embodiment of the present disclosure, the five to-be-compressed data blocks are in a one-to-one correspondence with the five pieces of PI. As shown in FIG. 3, an arrangement manner (namely, a storage manner) of the five to-be-compressed data blocks and the five pieces of PI is:

to-be-compressed data block-PI-to-be-compressed data block-PI. In other words, the to-be-compressed data block 1 is followed by the PI 1 corresponding to the to-be-compressed data block 1. The PI 1 is followed by the to-be-compressed data block 2. The to-be-compressed data block 2 is followed by the PI 2 corresponding to the to-be-compressed data block 2, and so on.

Figure 4:
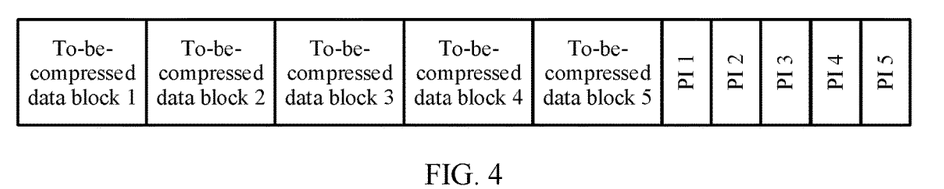
FIG. 4 is a schematic diagram of second to-be-compressed data.

FIG. 4 is a schematic diagram of second to-be-compressed data. The second to-be-compressed data shown in FIG. 4 is obtained after the to-be-compressed data block is separated from the PI in the first to-be-compressed data shown in FIG. 3. As shown in FIG. 4, a to-be-compressed data block and PI that are included in the second to-be-compressed data are the same as the to-be-compressed data block and the PI that are included in the first to-be-compressed data shown in FIG. 3. However, in the second to-be-compressed data, five to-be-compressed data blocks are continuously stored, and five pieces of PI are stored consecutively. In other words, addresses of storage units used to store the five to-be-compressed data blocks are consecutive, and addresses of storage units used to store the five pieces of PI are consecutive. As shown in FIG. 4, a to-be-compressed data block 1 is followed by a to-be-compressed data block 2, the to-be-compressed data block 2 is followed by a to-be-compressed data block 3, and so on. A to-be-compressed data block 5 is followed by PI 1, the PI 1 is followed by PI 2, and so on. In an implementation, physical addresses of storage units that store the five to-be-compressed data blocks are consecutive. In another implementation, logical addresses of the storage units that store the five to-be-compressed data blocks are consecutive.

For ease of description, an arrangement manner of the to-be-compressed data block and the PI in the first to-be-compressed data shown in FIG. 3 is referred to as alternate arrangement, and an arrangement manner of the to-be-compressed data block and the PI in the second to-be-compressed data shown in FIG. 4 is referred to as separate arrangement.

Optionally, in some embodiments, before step 101 is performed, it may be further determined whether the to-be-compressed data block and the PI are arranged alternatively or separately. If the arrangement manner of the to-be-compressed data block and the PI is the separate arrangement, step 101 may not be performed. If the arrangement manner of the to-be-compressed data block and the PI is the alternate arrangement, step 101 may be performed to change the arrangement manner of the to-be-compressed data block and the PI from the alternate arrangement to the separate arrangement. The to-be-compressed data block and the PI that are arranged separately facilitate subsequent processing. For example, this facilitates an operation of determining a redundant to-be-compressed data block in step 102. For another example, in step 103, the to-be-compressed data block and the PI are separately compressed. In this case, a plurality of to-be-compressed data blocks may be directly compressed, and a plurality of pieces of PI are compressed. There is no need to first extract the to-be-compressed data block from the to-be-compressed data block and the PI that are arranged alternatively, and then compress the to-be-compressed data block.

Certainly, in some embodiments, the to-be-compressed data block and the PI that are arranged alternatively may not be separated.

Figure 5:
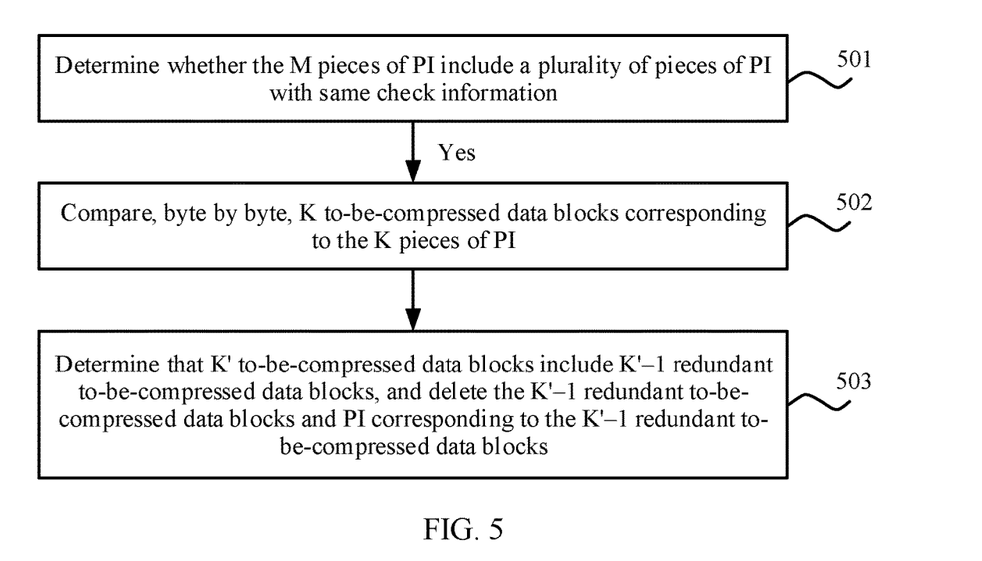
FIG. 5 is a schematic flowchart in which a redundant to-be-compressed data block and corresponding PI are deleted according to an embodiment of this application.

FIG. 5 is a schematic flowchart in which a redundant to-be-compressed data block and corresponding PI are deleted according to an embodiment of this application. For ease of description, it is assumed that objects processed in the method shown in FIG. 5 are also the M to-be-compressed data blocks and the M pieces of PI processed in the method shown in FIG. 2. An arrangement manner of the M to-be-compressed data blocks and the M pieces of PI may be separate arrangement or alternate arrangement. As described above, compared with the alternate arrangement, the separate arrangement of the to-be-compressed data block and the PI facilitates deletion of the redundant to-be-compressed data block.

501: Determine whether the M pieces of PI include a plurality of pieces of PI with same check information. When check information in the M pieces of PI is different, the M to-be-compressed data blocks do not include the redundant to-be-compressed data block, or when check information in the K of the M pieces of PI is the same, step 502 is performed, and K is a positive integer greater than or equal to 2 and less than or equal to M.

As described above, the check information is generated based on a data block. When two pieces of check information are different, two data blocks used to generate the two pieces of check information are different. When the two pieces of check information are the same, the two data blocks used to generate the two pieces of check information may be the same. To ensure that a deleted to-be-compressed data block is indeed the redundant to-be-compressed data block, when the two pieces of check information are the same, the two data blocks corresponding to the two pieces of check information further need to be compared byte by byte to determine whether the two data blocks are completely the same.

Optionally, in some embodiments, there is a low probability that different data blocks generate same check information. Therefore, if a plurality of pieces of check information are the same, it may be directly determined that there is a redundant to-be-compressed data block in to-be-compressed data blocks corresponding to the plurality of pieces of check information. In other words, if the plurality of pieces of check information are the same, it may be determined that the to-be-compressed data blocks corresponding to the plurality of pieces of check information are the same.

502: Compare, byte by byte, K to-be-compressed data blocks corresponding to the K pieces of PI. When byte-by-byte comparison results of the K to-be-compressed data blocks are different, the K to-be-compressed data blocks do not include the redundant to-be-compressed data block. In other words, when byte-by-byte comparison results of any two of the K to-be-compressed data blocks are different, any two of the K to-be-compressed data blocks are different. In this case, the M to-be-compressed data blocks do not include the redundant to-be-compressed data block. When byte-by-byte comparison results of K' of the K to-be-compressed data blocks are the same, step 503 is performed.

It may be understood that check information in a plurality of pieces of PI corresponding to a plurality of to-be-compressed data blocks on which byte-by-byte comparison needs to be performed is the same. Byte-by-byte comparison is not performed on two to-be-compressed data blocks corresponding to two pieces of PI whose check information is different. For example, it is assumed that to-be-compressed data blocks 1 to 5 respectively correspond to PI 1 to PI 5. It is assumed that check information of the PI 1, the PI 2, and the PI 3 is the same, check information of the PI 4 and the PI 5 is the same, and the check information of the PI 1 is different from that of the PI 4. In this case, byte-by-byte comparison needs to be performed between the to-be-compressed data block 1, the to-be-compressed data block 2, and the to-be-compressed data block 3. Byte-by-byte comparison needs to be performed between the to-be-compressed data block 4 and the to-be-compressed data block 5. However, the to-be-compressed data blocks 1 to 3 do not need to be compared, byte by byte, with the to-be-compressed data block 4 and the to-be-compressed data block 5.

The byte-by-byte comparison is to compare each byte in two or more data blocks. If the two data blocks are the same, corresponding bytes in the two data blocks are the same. If one bit of one corresponding byte in the two data blocks is different, the two data blocks are different.

It is assumed that a data block 1 includes two bytes: 1111 1111 0000 0000. A data block 2 includes two bytes: 1111 1111 0000 0000. It can be learned that the two bytes of the data block 1 are completely the same as the two bytes of the data block 2, and the data block 2 is a redundant data block. It is assumed that a data block 3 includes two bytes: 1111 1111 0000 0001. It can be learned that first 15 bits of the two bytes of the data block 1 are the same as those of the data block 3, but the last bit is different. Therefore, the data block 1 and the data block 3 are different.

503: Determine that the K' to-be-compressed data blocks include K'-1 redundant to-be-compressed data blocks, and delete the K'-1 redundant to-be-compressed data blocks and PI corresponding to the K'-1 redundant to-be-compressed data blocks.

For example, it is assumed that a byte-by-byte comparison result of the to-be-compressed data block 1, the to-be-compressed data block 2, and the to-be-compressed data block 3 is that the three to-be-compressed data blocks are completely the same. In this case, two to-be-compressed data blocks may be deleted, and only one of the three data blocks is retained. Compared with the to-be-compressed data block that is not deleted, the two to-be-compressed data blocks that are deleted are redundant. In other words, in the three to-be-compressed data blocks, the two to-be-compressed data blocks are redundant to-be-compressed data blocks. The two redundant to-be-compressed data blocks are the to-be-compressed data blocks that are deleted. Optionally, in some embodiments, the redundant to-be-compressed data block may be any to-be-compressed data block. Optionally, in some other embodiments, the retained to-be-compressed data block may be the first to-be-compressed data block or the last to-be-compressed data block in the K to-be-compressed data blocks.

Optionally, in some embodiments, a piece of redundant indication information may be further determined, and the redundant indication information is used to indicate related information of a redundant to-be-compressed data block that is deleted. The related information of the redundant to-be-compressed data block that is deleted may include a location of the redundant to-be-compressed data block that is deleted, and information about a specific to-be-compressed data block for which the redundant to-be-compressed data block that is deleted is redundant.

It may be understood that when a result determined in step 501 or step 502 is that the M to-be-compressed data blocks do not include the redundant to-be-compressed data block, step 102 shown in FIG. 1 does not need to be performed.

Optionally, in some other embodiments, even if there is the redundant to-be-compressed data block, the redundant to-be-compressed data block may not be deleted. In this case, step 102 shown in FIG. 1 may not be performed.

Figure 6:
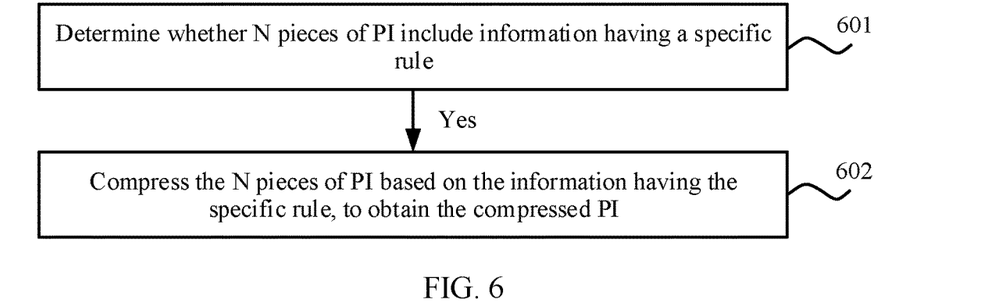
FIG. 6 is a schematic flowchart in which PI is compressed according to an embodiment of this application.

In a compression process of the to-be-compressed data block, a conventional data compression engine may be used to compress the to-be-compressed data block. Details are not described herein. With reference to FIG. 6, the following describes in detail how to compress PI to obtain compressed PI.

FIG. 6 is a schematic flowchart in which PI is compressed according to an embodiment of this application. For ease of description, it is assumed that there are a total of N pieces of to-be-compressed PI, where N is a positive integer greater than or equal to 2 and less than or equal to M. The N pieces of PI correspond to the M pieces of PI in the embodiment shown in FIG. 2. Further, if there is no redundant to-be-compressed data block in to-be-compressed data blocks corresponding to the M pieces of PI, or if an operation of deleting the redundant to-be-compressed data block is not performed, N is equal to M. In other words, if there is no redundant to-be-compressed data block in the to-be-compressed data blocks corresponding to the M pieces of PI, or if the operation of deleting the redundant to-be-compressed data block is not performed, the N pieces of PI are the M pieces of PI. If the to-be-compressed data blocks corresponding to the M pieces of PI include the redundant to-be-compressed data block, N is less than M, and a difference between M and N is a quantity of deleted pieces of PI.

601: Determine whether the N pieces of PI include information having a specific rule. If it is determined that a result is no (in other words, the N pieces of PI do not include the information having the specific rule), do not compress the N pieces of PI. If it is determined that the result is yes (in other words, the N pieces of PI include the information having the specific rule), step 602 is performed (to be specific, the N pieces of PI are compressed).

Based on whether content is the same, the information having the specific rule may be classified into first information and second information.

The first information includes N pieces of different information, and each of the N pieces of PI include one of the N pieces of different information. If one of the N pieces of different information is obtained, remaining N-1 pieces of information may be obtained according to the specific rule.

Optionally, in some embodiments, if the N pieces of different information are consecutive, the N pieces of different information may be referred to as the information having the specific rule. For example, it is assumed that N is equal to 6, and numbers of the six pieces of information are respectively 1, 2, 3, 4, 5, and 6. If the first of the six pieces of information and a total quantity of the pieces of information are known, the remaining five pieces of information may be obtained based on the first piece of information. If the last of the six pieces of information and the total quantity of the pieces of information are known, the remaining five pieces of information may be obtained based on the last piece of information. If any of the six pieces of information, a sequence number of the any piece of information, and the total quantity of the pieces of information are known, the remaining five pieces of information may be obtained based on the any piece of information.

In some other embodiments, if differences between any two pieces of the N pieces of different information are the same, the N pieces of different information may be referred to as the information having the specific rule. It may be understood that a difference between any two pieces of the N pieces of consecutive information is 1. If the difference between any two pieces of the N pieces of consecutive information is a positive integer greater than 1, the N pieces of different information may also be referred to as different information having the specific rule. For example, it is assumed that N is equal to 6, and numbers of the six pieces of information are respectively 2, 4, 6, 8, 10, and 12. If the first of the six pieces of information and a total quantity of the pieces of information are known, the remaining five pieces of information may be obtained based on the first piece of information. If the last of the six pieces of information and the total quantity of the pieces of information are known, the remaining five pieces of information may be obtained based on the last piece of information. If any of the six pieces of information, a sequence number of the any piece of information, and the total quantity of the pieces of information are known, the remaining five pieces of information may be obtained based on the any piece of information.

In some other embodiments, the remaining N-1 pieces of information can be obtained based on any one of the N pieces of different information and other related information (for example, a total quantity of pieces of information and a sequence and a specific rule of the N pieces of information), provided that the N pieces of different information have a particular rule. The N pieces of information may be referred to as N pieces of information having the specific rule. For example, the N pieces of different information may satisfy a Fibonacci sequence, a difference between adjacent information in the N pieces of information satisfies the Fibonacci sequence, or the like.

For example, as described above, the PI may include an LBA of a corresponding data block. If N LBAs included in the N pieces of PI are consecutive, or if differences between any two adjacent LBAs (for example, the first piece of PI and the second piece of PI, and the fourth piece of PI and the fifth piece of PI) in the N LBAs are equal, the N LBAs may be referred to as a group of first information.

The second information includes N pieces of same information, and each of the N pieces of PI include one of the N pieces of same information.

Information included in the N pieces of PI may include one or more groups of first information, and each group of first information includes N pieces of information having the specific rule. Similarly, the information included in the N pieces of PI may include one or more groups of second information, and each group of second information includes the N pieces of same information.

For example, as described above, the PI may include application information, and the application information may include application program information and version information of an application program. If N pieces of application program information included in the N pieces of PI are the same, the N pieces of application program information may be referred to as a group of second information. If N pieces of version information of the application program included in the N pieces of PI are the same, the N pieces of version information of the application program may be referred to as another group of second information.

602: Compress the N pieces of PI based on the information having the specific rule, to obtain compressed PI. The compressed PI includes one piece of the information having the specific rule.

Further, when the N pieces of PI include the first information (namely, N pieces of different information having the specific rule), the compressed PI may include first compressed information, and the first compressed information is one of the N pieces of different information. In the foregoing technical solution, when the N pieces of different information are compressed, only one of the N pieces of different information may be retained. During decompression, the remaining N-1 pieces of information may be obtained based on the retained information and the specific rule. In other words, in the foregoing technical solution, the N pieces of different information may be compressed into one piece of information.

When the N pieces of PI include the second information (namely, the N pieces of same information), the compressed PI may include second compressed information, and the second compressed information is one of the N pieces of same information. In the foregoing technical solution, when the N pieces of same information are compressed, only one of the N pieces of same information may be retained. In other words, in the foregoing technical solution, the N pieces of same information may be compressed into one piece of information.

As described above, the information included in the N pieces of PI may include one or more groups of first information, and each group of first information includes the N pieces of different information. If the N pieces of PI include one group of first information, the compressed PI may include one piece of first compressed information. The first compressed information is one of N pieces of different information in the group of first information. If the N pieces of PI include a plurality of groups of first information, the compressed information may include a plurality of pieces of first compressed information, and the plurality of pieces of first compressed information are in a one-to-one correspondence with the plurality of groups of first information. Each of the plurality of pieces of first compressed information is one of N pieces of different information included in a corresponding group of first information.

Similarly, the information included in the N pieces of PI may include one or more groups of second information, and each group of second information includes the N pieces of same information. If the N pieces of PI include one group of second information, the compressed PI may include one piece of second compressed information. The second compressed information is one of N pieces of same information in the group of first information. If the N pieces of PI include a plurality of groups of second information, the compressed information may include a plurality of pieces of second compressed information, and the plurality of pieces of second compressed information are in a one-to-one correspondence with the plurality of groups of second information. Each of the plurality of pieces of second compressed information is one of N pieces of same information included in a corresponding group of second information.

For example, it is assumed that the information included in the N pieces of PI includes one group of first information. The group of first information is N LBAs, and the N LBAs are consecutive. The compressed PI may include one piece of first compressed information. Optionally, in some embodiments, the first compressed information is the first LBA in the N consecutive LBAs. Optionally, in some other embodiments, the first compressed information is the last LBA in the N consecutive LBAs.

For another example, it is assumed that the information included in the N pieces of PI includes two groups of second information. A first group of second information is the N pieces of application program information, and a second group of second information is the version information of the application program. In other words, the application program information of the N pieces of PI is the same as the version information of the application program. In this case, the compressed PI may include two pieces of second compressed information the application program information and the version information of the application program. In other words, the compressed PI only needs to store one piece of application program information and version information of one application program.

In addition, the compressed PI may not include check information. Further, the check information is generated based on a corresponding to-be-compressed data block. The check information is used for communication and check between an upper-layer module at a compression layer and the compression layer. After obtaining the to-be-compressed data block from the upper-layer module, the compression layer may use the check information to verify whether an error occurs in the obtained data block. Compressed check information is not used for communication between the compression layer and a lower layer. Therefore, the check information may be deleted in a process of compressing the PI. During decompression, corresponding check information may be further generated based on the data block.

In addition, if the information included in the N pieces of PI further includes at least one group of third information in addition to the check information, each of the at least one group of third information includes N pieces of information, and the N pieces of PI each include the N pieces of information. Any two of the N pieces of information are different, and the N pieces of information have no specific rule. In other words, in addition to the check information, the information included in the N pieces of PI further includes information that does not belong to the first information or the second information. In this case, the at least one group of third information is retained in the compressed PI.

For example, it is assumed that the N pieces of application program information included in the N pieces of PI are the same, but the N pieces of version information of the application program are different. In this case, the compressed PI may include one piece of application program information and the N pieces of version information of the application program.

The compressed PI may further include compression indication information, and a length of the compression indication information is two bytes.

Figure 7:
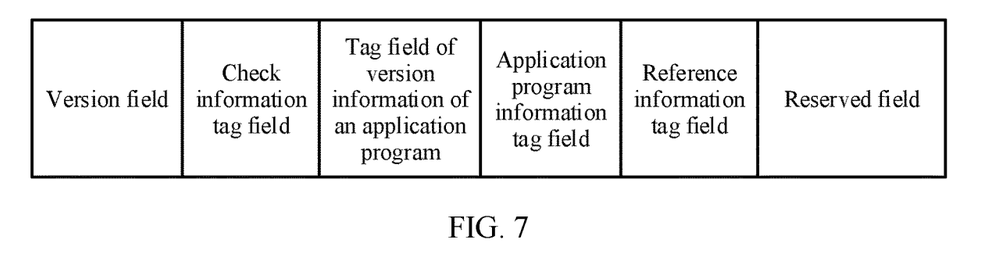
FIG. 7 is a schematic diagram of compression indication information.

FIG. 7 is a schematic diagram of compression indication information. As shown in FIG. 7, the compression indication information includes a version field, a check information tag field, a tag field of version information of an application program, an application program information tag field, a reference information tag field, and a reserved field.

It may be understood that content included in the compression indication information corresponds to content included in PI. For example, the PI includes check information, the version information of the application program, application program information, and the reference information. Therefore, the compression indication information includes the check information tag field, the tag field of the version information of the application program, the application program information tag field, and the reference information tag field. If the PI includes only the check information, the application program information, and the reference information, but does not include the version information of the application program, the compression indication information also includes the check information tag field, the application program information tag field, and the reference information tag field, but does not include the tag field of the version information of the application program.

A length of the version field is 4 bits, and the version field is used to indicate a version number.

A length of the check information tag field is 1 bit, and the check information tag field is used to indicate whether the check information is deleted. For example, if a value of the check information tag field is 0, it indicates that the check information is deleted. If the value of the check information tag field is 1, it indicates that the check information is not deleted.

A length of the tag field of the version information of the application program is 1 bit, and the tag field of the version information of the application program is used to indicate whether the version information of the application program in the PI is compressed. For example, if a value of the tag field of the version information of the application program is 0, it indicates that the version information of the application program in the compressed PI is compressed version information of the application program. In other words, when the value of the tag field of the version information of the application program is 0, it indicates that the compressed PI includes only one piece of version information of an application program, and version information of an application program in the N pieces of PI is the same as the version information of the application program in the compressed PI. That the value of the tag field of the version information of the application program is 1 indicates that the version information of the application program in the compressed PI includes N pieces of version information of an application program in total. The N pieces of version information of an application program are the version information of the application program in the N pieces of PI respectively.

A length of the application program information tag field is 1 bit, and the application program information tag field is used to indicate whether the application program information in the PI is compressed. For example, if a value of the application program information tag field is 0, it indicates that the application program information in the compressed PI is compressed application program information. In other words, that the value of the application program information tag field is 0 indicates that the compressed PI includes only one piece of application program information, and application program information of the N pieces of PI is the same as the application program information in the compressed PI. That the value of the application program information tag field is 1 indicates that the application program information in the compressed PI includes N pieces of application program information in total. The N pieces of application program information are the application program information of the N pieces of PI respectively.

A length of the reference information tag field is 1 bit, and the reference information tag field is used to indicate whether the application program information in the PI is compressed. For example, if a value of the reference information tag field is 0, it indicates that the application program information in the compressed PI is compressed reference information. In other words, that the value of the reference information tag field is 0 indicates that the compressed PI includes only one piece of reference information. The reference information is one of N pieces of reference information included in the N pieces of PI, and remaining reference information in the N pieces of PI may be determined based on the reference information in the compressed PI. That the value of the reference information tag field is 1 indicates that the reference information in the compressed PI includes the N pieces of reference information in total, and the N pieces of reference information are reference information in the N pieces of PI respectively.

A length of the reserved field is 8 bits. The reserved field may be used to store some related information. For example, the information stored in the reserved field may include one piece of indication information, and the indication information is used to indicate which piece of reference information in the N pieces of reference information is the reference information in the compressed PI. For another example, the compressed PI may include a result obtained after a plurality of groups of PI are compressed. The information stored in the reserved field may include one piece of indication information, and the indication information is used to indicate a correspondence between each field in the compressed PI and the PI.

Figure 8:
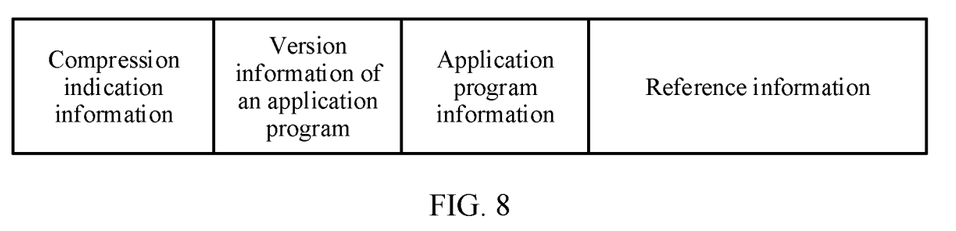
FIG. 8 is a schematic diagram of compressed PI.

FIG. 8 is a schematic diagram of compressed PI. As shown in FIG. 8, the compressed PI includes 2-byte compression indication information, 1-byte version information of an application program, 1-byte application program information, and 4-byte reference information. In other words, in a plurality of pieces of PI corresponding to the PI, version information of an application program is the same, application program information is the same, and reference information has a specific rule.

Usually, in a plurality of pieces of PI corresponding to a plurality of to-be-compressed data blocks, a plurality of pieces of application program information are the same, a plurality of pieces version information of an application program are the same, and a plurality of pieces of reference information are consecutive. Therefore, usually, the plurality of pieces of PI may be compressed into one compressed PI having a length of 8 bytes, as shown in FIG. 8. In this case, for data whose length is X before compression, a compression rate (it is assumed that the plurality of pieces of PI may be compressed into the compressed PI, as shown in FIG. 8, having the length of 8 bytes) obtained after the compression is performed by using the method shown in this embodiment of this application may be shown in formula 1.1:

$$CR = \frac{X}{Y' + 8 + [(Y' + 8)/512] * 8}. \quad (1.1)$$

In the formula 1.1, a numerator represents data before compression, a denominator represents data after compression, X represents a size of the data before compression, Y' represents a size of a to-be-compressed data block after compression, and 8 is a size of the plurality of pieces of PI after compression. A compressed to-be-compressed data block and the PI further need to be divided, with a length of 512 bytes, into a plurality of data blocks. Each data block has a piece of corresponding 8-byte PI. Therefore, the data after compression needs to be added with [(Y'+8)/512]*8.

The following describes the technical solutions of this application with reference to the specific embodiments. It may be understood that the following specific embodiments are merely intended to help a person skilled in the art better understand the technical solutions of this application, but are not intended to limit the technical solutions of this application. For ease of description, to-be-compressed data mentioned in the following embodiments is to-be-compressed data obtained after a to-be-compressed data block is separated from PI and a redundant to-be-compressed data block is deleted.

In this embodiment of the present disclosure, a storage array is used as an example. A controller of the storage array obtains to-be-compressed data 1. The to-be-compressed data 1 includes 16 to-be-compressed data blocks and 16 pieces of PI corresponding to the 16 to-be-compressed data blocks. 16 LBAs included in the 16 pieces of PI are consecutive, version information of an application program in the 16 pieces of PI is the same, and application program information in the 16 pieces of PI is the same. In this case, the controller of the storage array may determine compressed PI obtained after the 16 pieces of PI are compressed. The compressed PI includes one LBA, one piece of version information of an application program, and one piece of application program information. The LBA is start information of the 16 LBAs. The piece of version information of an application program included in the compressed PI is version information of an application program included in each of the 16 pieces of PI. Similarly, the piece of application program information included in the compressed PI is application program information included in each of the 16 pieces of PI. The compressed PI may further include compression indication information. Values of a check information tag field, a tag field of version information of an application program, an application program information tag field, and a reference information tag field in the compression indication information are all 0. The compressed PI does not include check information in the 16 pieces of PI.

The controller of the storage array obtains to-be-compressed data 2. The to-be-compressed data 2 includes 16 to-be-compressed data blocks and 16 pieces of PI corresponding to the 16 to-be-compressed data blocks. 16 LBAs included in the 16 pieces of PI are consecutive, version information of an application program in the 16 pieces of PI is not completely the same, and application program information in the 16 pieces of PI is the same. In this case, the controller of the storage array may determine compressed PI obtained after the 16 pieces of PI are compressed. The compressed PI includes one LBA, 16 pieces of version information of an application program, and one piece of application program information. The LBA is start information of the 16 LBAs. The 16 pieces of version information of an application program included in the compressed PI are version information of an application program included in each of the 16 pieces of PI. The piece of application program information included in the compressed PI is application program information included in each of the 16 pieces of PI. The compressed PI may further include compression indication information. In the compression indication information, values of a check information tag field, an application program information tag field, and a reference information tag field are 0, and a value of a tag field of version information of an application program is 1. The compressed PI does not include check information in the 16 pieces of PI.

The controller of the storage array obtains to-be-compressed data 3. The to-be-compressed data 3 includes 16 to-be-compressed data blocks and 16 pieces of PI corresponding to the 16 to-be-compressed data blocks. LBAs in the first piece of PI to the ninth piece of PI in 16 LBAs included in the 16 pieces of PI are consecutive, and LBAs in the tenth piece of PI to the sixteenth piece of PI are consecutive. In addition, the LBA of the ninth piece of PI and the LBA of the tenth piece of PI are not consecutive. Version information of an application program in the first piece of PI to the ninth piece of PI in the version information of the application program in the 16 pieces of PI is the same, and version information of an application program in the tenth piece of PI to the sixteenth piece of PI is the same. In addition, the version information of the application program in the ninth piece of PI is different from the version information of the application program in the tenth piece of PI. Application program information in the first piece of PI to the ninth piece of PI in the application program information in the 16 pieces of PI is the same, and application program information in the tenth piece of PI to the sixteenth piece of PI is the same. In addition, the application program information in the ninth piece of PI is different from the application program information in the tenth piece of PI.

Optionally, in some embodiments, the controller of the storage array may neither compress the 16 pieces of PI nor perform any processing on the 16 pieces of PI.

Optionally, in some other embodiments, the controller of the storage array may delete check information included in each of the 16 pieces of PI, to obtain 16 processed pieces of PI. The computer device may further add one piece of indication information, and the indication information is used to indicate that the processed 16 pieces of PI do not include the check information. For a form of the indication information, refer to a format of the compression indication information.

Optionally, in some other embodiments, the controller of the storage array may compress the first piece of PI to the ninth piece of PI to obtain a piece of compressed PI (which is referred to as compressed PI 1), and compress the tenth piece of PI to the sixteenth piece of PI to obtain another piece of compressed PI (which is referred to as compressed PI 2).

The compressed PI 1 includes one LBA, one piece of version information of an application program, and one piece of application program information. The LBA is a start address of nine LBAs in the first piece of PI to the ninth piece of PI. The piece of version information of an application program included in the compressed PI 1 is version information of an application program included in each of the first piece of PI to the ninth piece of PI. Similarly, the piece of application program information included in the compressed PI 1 is application program information included in each of the first piece of PI to the ninth piece of PI. The compressed PI 1 may further include compression indication information. Values of a check information tag field, an application program information tag field, a tag field of version information of an application program, and a reference information tag field in the compression indication information are all 0. The compressed PI 1 does not include check information in the first piece of PI to the ninth piece of PI.

The compressed PI 2 includes one LBA, one piece of version information of an application program, and one piece of application program information. The LBA is start information of seven LBAs in the tenth piece of PI to the sixteenth piece of PI. The piece of version information of an application program included in the compressed PI 2 is version information of an application program included in each of the tenth piece of PI to the sixteenth piece of PI. Similarly, the piece of application program information included in the compressed PI 2 is application program information included in each of the tenth piece of PI to the sixteenth piece of PI. The compressed PI 2 may further include compression indication information. Values of a check information tag field, an application program information tag field, a tag field of version information of an application program, and a reference information tag field in the compression indication information are all 0. The compressed PI 2 does not include check information in the tenth piece of PI to the sixteenth piece of PI.

Figure 9:
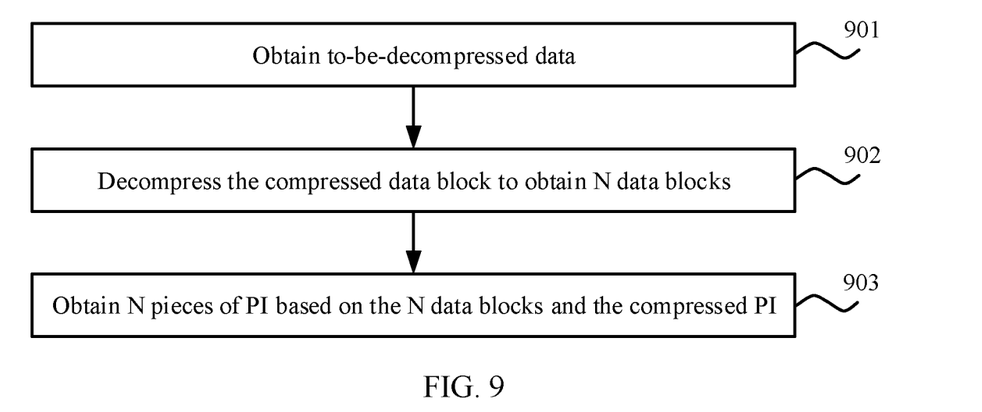
FIG. 9 is a schematic flowchart of a data decompression method according to an embodiment of this application.

FIG. 9 is a schematic flowchart of a data decompression method according to an embodiment of this application. The data decompression method shown in FIG. 9 is a method used to decompress compressed data obtained by using the method shown in FIG. 1.

901: Obtain to-be-decompressed data, where the to-be-decompressed data includes a compressed data block and compressed PI. The to-be-decompressed data is obtained by using the data compression method shown in FIG. 1.

902: Decompress the compressed data block to obtain N data blocks.

903: Obtain N pieces of PI based on the N data blocks and the compressed PI, where the N pieces of PI are in a one-to-one correspondence with the N data blocks.

The N pieces of check information are obtained based on the N data blocks. For a specific method for determining the check information, refer to the embodiment shown in FIG. 2. Details are not described herein again.

The N pieces of PI are determined based on the N pieces of check information and the compressed PI.

Optionally, in some embodiments, when the compressed PI includes only one piece of version information of an application program, one piece of application program information, and one piece of reference information, it may be determined that application program information in the N pieces of PI is the application program information in the compressed PI, and version information of an application program in the N pieces of PI is the version information of the application program in the compressed PI. Reference information in the N pieces of PI may be determined based on the reference information in the compressed PI.

Optionally, in some other embodiments, the compressed PI may include compression indication information. It may be determined, based on the compression indication information, that the version information of the application program, the application program information, and the reference information that are in the PI are compressed version information of the application program, compressed application program information, and compressed reference information. In this case, it may be determined that the application program information in the N pieces of PI is the application program information in the compressed PI, and the version information of the application program in the N pieces of PI is the version information of the application program in the compressed PI. The reference information in the N pieces of PI may be determined based on the reference information in the compressed PI.

Optionally, in some other embodiments, when the compressed PI includes only one piece of version information of an application program, N pieces of application program information, and one piece of reference information, it may be determined that N pieces of application program information in the N pieces of PI are respectively the N pieces of application program information in the compressed PI, and the version information of the application program in the N pieces of PI is the version information of the application program in the compressed PI. The reference information in the N pieces of PI may be determined based on the reference information in the compressed PI.

Optionally, in some other embodiments, the compressed PI may include compression indication information. It may be determined, based on the compression indication information, that both the version information of the application program and the reference information that are in the PI are compressed version information of the application program and compressed reference information. The application program information is not compressed application program information. In this case, it may be determined that the N pieces of application program information in the N pieces of PI are respectively the N pieces of application program information in the compressed PI, and the version information of the application program in the N pieces of PI is the version information of the application program in the compressed PI. The reference information in the N pieces of PI may be determined based on the reference information in the compressed PI.

Optionally, in some embodiments, after the N data blocks and the N pieces of PI are obtained, it may be further determined that the N data blocks and the N pieces of PI are obtained after redundancy deletion is performed. Therefore, the N data blocks and the N pieces of PI may be restored to data before the redundancy deletion is performed. In other words, a redundant data block and corresponding PI that are deleted may be re-inserted into the N data blocks and the N pieces of PI, to obtain M data blocks and M pieces of PI. Whether a redundant to-be-compressed data block is deleted may be determined based on related information of a redundant to-be-compressed data block that is deleted. When it is determined that there is a deleted data block, a specific location of the deleted data block is determined. In addition, it is determined that for which data blocks, redundant data blocks are deleted.

For example, it is determined that a redundant data block of a data block 1 is deleted, and the deleted data block is the fifth data block. In this case, one data block 1 is added after the fourth data block, and a piece of PI that is the same as a piece of PI corresponding to the data block 1 is added after the fourth piece of PI.

Optionally, in some embodiments, an inverse operation of separating the data block from the PI may be further performed on the M data blocks and the M pieces of PI. In other words, the data block and the PI that are arranged separately may be restored to the data block and the PI that are arranged alternatively.

As described above, the data decompression method shown in FIG. 9 is the method used to decompress the compressed data obtained by using the method shown in FIG. 1. Therefore, a specific implementation of the data decompression method shown in FIG. 9 is equivalent to an inverse process of an implementation of the data compression method shown in FIG. 1. Therefore, for specific content of the data decompression method shown in FIG. 9, refer to the embodiments shown in FIG. 1 to FIG. 8. Details are not described herein again.

Figure 10:
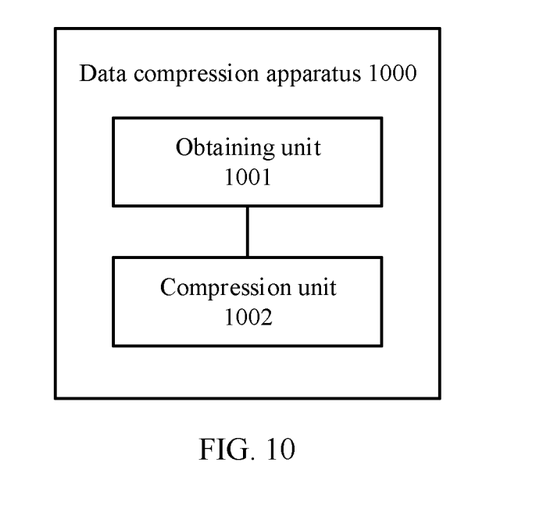
FIG. 10 is a schematic structural diagram of a data compression apparatus according to an embodiment of this application.

FIG. 10 is a schematic structural diagram of a data compression apparatus according to an embodiment of this application. The data compression apparatus may be a storage array, a distributed storage system, or the like, or may be a host, a server, or the like, or may be data compression hardware, for example, a compression card. As shown in FIG. 10, the data compression apparatus 1000 may include an obtaining unit 1001 and a compression unit 1002.

The obtaining unit 1001 is configured to obtain N to-be-compressed data blocks and N pieces of PI. The N to-be-compressed data blocks are in a one-to-one correspondence with the N pieces of PI, and N is a positive integer greater than or equal to 2.

The compression unit 1002 is configured to compress the N to-be-compressed data blocks to obtain a compressed data block.

The compression unit 1002 is configured to compress the N pieces of PI to obtain compressed PI.

For specific functions and beneficial effects of the obtaining unit 1001 and the compression unit 1002, refer to the embodiments in FIG. 1 to FIG. 8. Details are not described herein again.

In a possible embodiment, units of the data compression apparatus may be implemented by a processor in the embodiments of the present disclosure. In another implementation, the units of the data compression apparatus may be implemented by software, or may be implemented by a combination of software and hardware.

Figure 11:
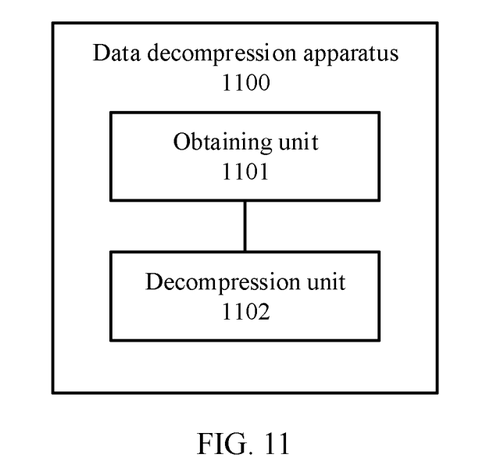
FIG. 11 is a schematic structural diagram of a data decompression apparatus according to an embodiment of this application.

Corresponding to the data compression apparatus shown in FIG. 10, FIG. 11 is a schematic structural diagram of a data decompression apparatus according to an embodiment of this application. As shown in FIG. 11, the data decompression apparatus 1100 may include an obtaining unit 1101 and a decompression unit 1102.

The obtaining unit 1101 is configured to obtain to-be-decompressed data. The to-be-decompressed data includes a compressed data block and compressed PI.

The decompression unit 1102 is configured to decompress the compressed data block to obtain N data blocks, where N is a positive integer greater than or equal to 2.

The decompression unit 1102 is further configured to determine N pieces of PI based on the compressed PI and the N data blocks. The N data blocks are in a one-to-one correspondence with the N pieces of PI.

For specific functions and beneficial effects of the obtaining unit 1101 and the decompression unit 1102, refer to the embodiment in FIG. 9. Details are not described herein again.

In a possible embodiment, units of the data decompression apparatus may be implemented by a processor in the embodiments of the present disclosure. In another implementation, the units of the data decompression apparatus may be implemented by software, or may be implemented by a combination of software and hardware.

Figure 12:
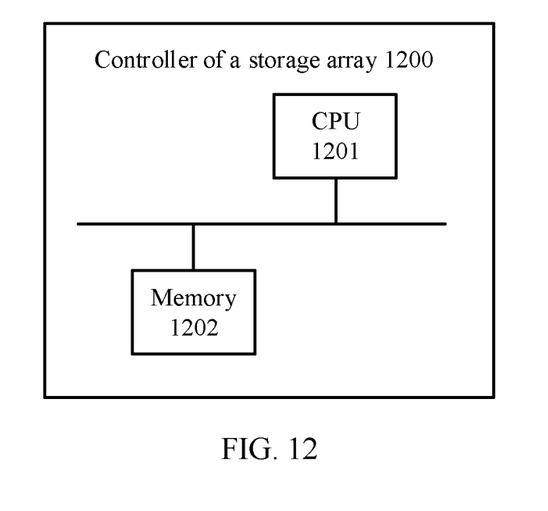
FIG. 12 is a structural block diagram of a controller of a storage array according to an embodiment of this application.

FIG. 12 is a structural block diagram of a controller of a storage array according to an embodiment of this application. As shown in FIG. 12, the controller 1200 of the storage array includes a CPU 1201 and a memory 1202. The CPU 1201 and the memory 1202 communicate with each other through an internal connection path. The CPU 1201 may be configured to process data, control the controller of the storage array, execute a software program, process data of the software program, and the like. The memory 1202 is mainly configured to store the software program and the data. It may be understood that in addition to the CPU and the memory shown in FIG. 12, the controller of the storage array may further include another component.

An embodiment of this application further provides a computer-readable storage medium. The computer-readable storage medium stores an instruction, and when the instruction is executed, the data compression method in the foregoing method embodiment is performed.

An embodiment of this application further provides a computer program product including an instruction. When the instruction is executed, the data compression method in the foregoing method embodiment is performed.

An embodiment of this application further provides a computer-readable storage medium. The computer-readable storage medium stores an instruction, and when the instruction is executed, the data decompression method in the foregoing method embodiment is performed.

An embodiment of this application further provides a computer program product including an instruction. When the instruction is executed, the data decompression method in the foregoing method embodiment is performed.

A person of ordinary skill in the art may be aware that units and algorithm steps in the examples described with reference to the embodiments disclosed in this specification may be implemented by electronic hardware or a combination of computer software and electronic hardware. Whether the functions are performed by hardware or software depends on a particular application and a design constraint condition of the technical solutions. A person skilled in the art may use different methods to implement the described functions for each particular application, but it should not be considered that the implementation goes beyond the scope of this application.

It may be clearly understood by a person skilled in the art that, for convenient and brief description, for a detailed working process of the foregoing system, apparatus, and unit, refer to a corresponding process in the foregoing method embodiments. Details are not described herein again.

In the several embodiments provided in this application, it should be understood that the disclosed system, apparatus, and method may be implemented in another manner. For example, the described apparatus embodiment is merely an example. For example, division into the units is merely logical function division and may be other division in an actual implementation. For example, a plurality of units or components may be combined or integrated into another system, or some features may be ignored or not performed. In addition, the displayed or discussed mutual coupling or a direct coupling or a communication connection may be implemented through some interfaces. An indirect coupling or a communication connection between the apparatuses or units may be implemented in an electronic form, a mechanical form, or in another form.

The units described as separate parts may or may not be physically separate, and parts displayed as units may or may not be physical units, may be located in one position, or may be distributed on a plurality of network units. Some or all of the units may be selected based on an actual requirement to achieve the objectives of the solutions of the embodiments.

In addition, functional units in the embodiments of this application may be integrated into one processing unit, or each of the units may exist alone physically, or two or more units are integrated into one unit.

When the functions are implemented in a form of a software functional unit and sold or used as an independent product, the functions may be stored in a computer-readable storage medium. Based on such an understanding, the technical solutions of this application essentially, or the part contributing to the other approaches, or a part of the technical solutions may be implemented in a form of a software product. The computer software product is stored in a storage medium, and includes several instructions for instructing a computer device (which may be a personal computer, a server, a network device, or the like) to perform all or some of the steps of the methods described in the embodiments of this application. The foregoing storage medium includes any medium that can store program code, such as a Universal Serial Bus (USB) flash drive, a removable hard disk, a read-only memory (ROM), a random-access memory (RAM), a magnetic disk, or a compact disc. In addition, various storage media described in this specification may indicate one or more devices and/or other machine-readable media that are configured to store information.

What is claimed is:

1. A method comprising:
   obtaining N to-be-compressed data blocks and N pieces of protection information (PI), wherein the N to-be-compressed data blocks are in a one-to-one correspondence with the N pieces of PI, and wherein N is a positive integer greater than or equal to 2;
   compressing the N to-be-compressed data blocks to obtain a compressed data block; and
   compressing the N pieces of PI to obtain compressed PI independently of compressing the N to-be-compressed data blocks.

2. The method of claim 1, wherein the N pieces of PI comprise first information having a specific rule, and wherein the method further comprises further compressing, based on the first information, the N pieces of PI to obtain the compressed PI.

3. The method of claim 1, wherein a first plurality of addresses storing the N to-be-compressed data blocks are consecutive, and wherein a second plurality of addresses storing the N pieces of PI are consecutive.

4. The method of claim 1, further comprising:
   obtaining M to-be-compressed data blocks and M pieces of PI, wherein the M to-be-compressed data blocks are in a one-to-one correspondence with the M pieces of PI, wherein the M to-be-compressed data blocks comprise the N to-be-compressed data blocks, wherein the M pieces of PI comprise the N pieces of PI, and wherein M is a positive integer greater than or equal to N; and
   determining whether the M to-be-compressed data blocks comprise a redundant to-be-compressed data block;
   wherein when the M to-be-compressed data blocks comprise the redundant to-be-compressed data block, the method further comprises:
   deleting the redundant to-be-compressed data block from the M to-be-compressed data blocks to obtain the N to-be-compressed data blocks; and
   deleting, from the M pieces of PI, a piece of PI corresponding to the redundant to-be-compressed data block to obtain the N pieces of PI, and
   wherein when the M to-be-compressed data blocks do not comprise the redundant to-be-compressed data block, the method further comprises:
   identifying that the M to-be-compressed data blocks are the N to-be-compressed data blocks; and
   identifying that the M pieces of PI are the N pieces of PI.

5. The method of claim 4, further comprising determining whether the M pieces of PI comprise a plurality of pieces of PI comprising same check information.

6. The method of claim 5, further comprising:
   identifying that the M to-be-compressed data blocks do not comprise the redundant to-be-compressed data block when check information in the M pieces of PI are different;
   performing a byte-by-byte comparison on K to-be-compressed data blocks corresponding to K pieces of PI when check information in K the M pieces of PI are the same, wherein K is a positive integer greater than or equal to 2 and less than or equal to M;
   identifying that the K to-be-compressed data blocks do not comprise the redundant to-be-compressed data block when byte-by-byte comparison results of the K to-be-compressed data blocks are different; and
   identifying that K' to-be-compressed data blocks comprise K'-1 redundant to-be-compressed data blocks when byte-by-byte comparison results of K' of the K to-be-compressed data blocks are same, wherein K' is a positive integer greater than or equal to 2 and less than or equal to K.

7. A method comprising:
   obtaining to-be-decompressed data comprising a compressed data block and compressed protection information (PI);

decompressing the compressed data block to obtain N data blocks, wherein N is a positive integer greater than or equal to 2; and determining N pieces of PI based on the compressed PI and the N data blocks, wherein the N data blocks are in a one-to-one correspondence with the N pieces of PI.

8. The method of claim 7, further comprising:

determining N pieces of check information based on the N data blocks;

determining, based on the compressed PI, N pieces of information comprising a specific rule, wherein the compressed PI comprises one of the N pieces of information; and further determining the N pieces of PI based on the N pieces of check information and the N pieces of information, wherein each of the N pieces of PI comprises one of the N pieces of check information and one of the N pieces of information.

9. The method of claim 7, wherein a first plurality of addresses storing the N data blocks are consecutive, and wherein a second plurality of addresses storing the N pieces of PI are consecutive.

10. The method of claim 7, further comprising:

determining, based on the N data blocks, M data blocks comprising the N data blocks, wherein M is a positive integer greater than N, and wherein M-N data blocks in the M data blocks are redundant data blocks of a data block in the N data blocks; and determining, based on the N pieces of PI, M pieces of PI comprising the N pieces of PI, wherein M-N pieces of PI in the M pieces of PI correspond to the redundant data blocks, and wherein the M data blocks are in a one-to-one correspondence with the M pieces of PI.

11. A storage array comprising:

a memory configured to store programming instructions; and a controller coupled to the memory, wherein the programming instructions cause the controller to be configured to:

obtain N to-be-compressed data blocks and N pieces of protection information (PI), wherein the N to-be-compressed data blocks are in a one-to-one correspondence with the N pieces of PI, and wherein N is a positive integer greater than or equal to 2;

compress the N to-be-compressed data blocks to obtain a compressed data block; and compress the N pieces of PI to obtain compressed PI independently of compressing the N to-be-compressed data blocks.

12. The storage array of claim 11, wherein the N pieces of PI comprise first information having a specific rule, and wherein the programming instructions further cause the controller to be configured to further compress, based on the information, the N pieces of PI to obtain the compressed PI.

13. The storage array of claim 11, wherein a first plurality of addresses storing the N to-be-compressed data blocks are consecutive, and wherein a second plurality of addresses storing the N pieces of PI are consecutive.

14. The storage array of claim 11, wherein the programing instructions further cause the controller to be configured to:

obtain M to-be-compressed data blocks and M pieces of PI, wherein the M to-be-compressed data blocks are in a one-to-one correspondence with the M pieces of PI, wherein the M to-be-compressed data blocks comprise the N to-be-compressed data blocks, wherein the M pieces of PI comprise the N pieces of PI, and wherein M is a positive integer greater than or equal to N; and determine whether the M to-be-compressed data blocks comprise a redundant to-be-compressed data block, wherein when the M to-be-compressed data blocks comprise the redundant to-be-compressed data block, the programming instructions further cause the controller to be configured to:

delete the redundant to-be-compressed data block from the M to-be-compressed data blocks to obtain the N to-be-compressed data blocks; and delete, from the M pieces of PI, a piece of PI corresponding to the redundant to-be-compressed data block, to obtain the N pieces of PI, and wherein when the M to-be-compressed data blocks do not comprise the redundant to-be-compressed data block, the programming instructions further cause the controller to be configured to:

identify that the M to-be-compressed data blocks are the N to-be-compressed data blocks; and identify that the M pieces of PI are the N pieces of PI.

15. The storage array of claim 14, wherein the programming instructions further cause the controller to be configured to determine whether the M pieces of PI comprise a plurality of pieces of PI comprising same check information.

16. The storage array of claim 15, wherein the programming instructions further cause the controller to be configured to:

identify that the M to-be-compressed data blocks do not comprise the redundant to-be-compressed data block when check information in the M pieces of PI are different;

perform a byte-by-byte comparison on K to-be-compressed data blocks corresponding to K pieces of PI when check information in K of the M pieces of PI are the same, wherein K is a positive integer greater than or equal to 2 and less than or equal to M;

identify that the K to-be-compressed data blocks do not comprise the redundant to-be-compressed data block when byte-by-byte comparison results of the K to-be-compressed data blocks are different; and identify that K' to-be-compressed data blocks comprise K'-1 redundant to-be-compressed data blocks when byte-by-byte comparison results of K' of the K to-be-compressed data blocks are same, wherein K' is a positive integer greater than or equal to 2 and less than or equal to K.

17. A storage array comprising:

a memory configured to store programming instructions; and a controller coupled to the memory, wherein the programming instructions cause the controller to be configured to:

obtain to-be-decompressed data comprising a compressed data block and compressed protection information (PI);

decompress the compressed data block to obtain N data blocks, wherein N is a positive integer greater than or equal to 2; and determine N pieces of PI based on the compressed PI and the N data blocks, wherein the N data blocks are in a one-to-one correspondence with the N pieces of PI.

18. The storage array of claim 17, wherein the programming instructions further cause the controller to be configured to:

determine N pieces of check information based on the N data blocks;

determine, based on the compressed PI, N pieces of information comprising a specific rule, wherein the compressed PI comprises one of the N pieces of information; and further determine the N pieces of PI based on the N pieces of check information and the N pieces of information, wherein each of the N pieces of PI comprises one of the N pieces of check information and the one of the N pieces of information.

19. The storage array of claim 17, wherein a first plurality of addresses storing the N data blocks are consecutive, and wherein a second addresses of addresses storing the N pieces of PI are consecutive.

20. The storage array of claim 17, wherein the programming instructions further cause the controller to be configured to:

determine, based on the N data blocks, M data blocks comprising the N data blocks, wherein M is a positive integer greater than N, and wherein M-N data blocks in the M data blocks are redundant data blocks of a data block in the N data blocks; and determine, based on the N pieces of PI, M pieces of PI comprising the N pieces of PI, wherein M-N pieces of PI in the M pieces correspond to the redundant data blocks, and wherein the M data blocks are in a one-to-one correspondence with the M pieces of PI.

* * * * *